United States Patent [19]
Dimos et al.

[11] Patent Number: 6,096,127
[45] Date of Patent: Aug. 1, 2000

[54] TUNEABLE DIELECTRIC FILMS HAVING LOW ELECTRICAL LOSSES

[75] Inventors: Duane Brian Dimos; Robert William Schwartz; Mark Victor Raymond, all of Albuquerque, N. Mex.; Husam Niman Al-Shareef, Boise, Id.; Carl Mueller, Lakewood; David Galt, Denver, both of Colo.

[73] Assignee: Superconducting Core Technologies, Inc., Golden, Colo.

[21] Appl. No.: 08/807,334

[22] Filed: Feb. 28, 1997

[51] Int. Cl.$^7$ ........................................................ C30B 1/00
[52] U.S. Cl. .............................. 117/9; 427/554; 427/566; 427/126.3; 427/255.3; 427/376.2; 427/376.4; 204/192.22
[58] Field of Search .................................... 427/554, 566, 427/126.3, 255.3, 376.2, 376.4; 204/192.22; 117/9

[56] References Cited

U.S. PATENT DOCUMENTS

| | | | |
|---|---|---|---|
| 4,675,123 | 6/1987 | Tsunooka et al. | 252/62.9 |
| 5,427,988 | 6/1995 | Sengupta et al. | 501/137 |
| 5,442,585 | 8/1995 | Eguchi et al. | 365/149 |
| 5,448,067 | 9/1995 | Micheli | 250/338.2 |
| 5,453,908 | 9/1995 | Tsu et al. | 361/321.5 |
| 5,486,491 | 1/1996 | Sengupta et al. | 501/137 |
| 5,663,556 | 9/1997 | Wessels et al. | 250/214.1 |
| 5,753,934 | 5/1998 | Yano et al. | 257/30 |
| 5,760,432 | 6/1998 | Abe et al. | 257/295 |
| 5,790,367 | 8/1998 | Mateika et al. | 361/321.4 |

OTHER PUBLICATIONS

Kingery, W.D., *Introduction to Ceramics*, John Wiley and Sons, pp. 448–465, 1976.

Donald L. Smith, "Thin–Film Deposition", Sections 5.3.4–5.4.2, 1995.

von Toshio Mitsui et al., "Band 3 Ferro–Und Antiferroelektrische Substanzen", p. 296, 1969.

G. Arlt et al., "Dielectric Properties of Fine–Grained Barium Titanate Ceramics", J. App. Phys. vol. 58, No. 4, pp. 1619–1625, Aug. 15, 1985.

Majed S. Mohammed et al., "Microstructure and Ferroelectric Properties of Fine–Grained $Ba_xSr_{1-x}TiO_3$ Thin Films Prepared By Metalorganic Decompositin", J. Mater. Res., vol. 11, No. 10, pp. 2588–2593, Oct. 1996.

Shintaro Yamamichi et al., "(Ba+Sr)/Ti Ratio Dependence of the Dielectric Properties for $Ba_{0.5}Sr_{0.5}TiO_3$ Thin Films Prepared by Ion Beam Sputtering", Appl. Phys. Lett., vol. 64, No. 13, pp. 1644–1646, Mar. 1994.

C–J Peng et al., "Grain Growth in Donor–Doped $SrTiO_3$", J. Mater. Res., vol. 5, No. 6, pp. 1237–1245, Jun. 1990.

Takeshi Tomio et al., "Control of Electric Conductivity in Laser Deposited $SrTiO_3$ Thin Films With Nb Doping", J. Appl. Phys., vol. 76, No. 10, pp. 5886–5890, Nov. 1994.

Detlev F.K. Hennings et al., "Control of Liquid–Phase–Enhanced Discontinuous Grain Growth in Barium Titanate", J. Am. Ceram. Soc., vol. 70, No. 1, pp. 23–27, Jan. 1987.

Manfred Kahn, "Preparation of Small–Grained and Large–Grained Ceramics From Nb–Doped $BaTiO_3$", J. Am. Ceram. Soc., vol. 58, No. 9, pp. 452–454, Sep. 1971.

Kasturi L. Copra, "Thin Film Phenomena", pp. 182–184, 1969.

Knauss, L.A.; Pond, J.M.; Horwitz, J.S.; Chrisey, D.B.; Mueller, C.H. and Treece, C.H.; The effect of annealing on the structure and dielecric properties of $Ba_xSr_{1-x}TiO_3$ ferroelectric thin films; Appl. Phys. Lett. 69 (1) Jul. 1, 1996; pp. 25–27.

Rupprecht, G. and Bell, R.O.; Microwave Losses in Strontium Titanate above the Phase Transition; Physical Review; vol. 125, No. 6, Mar. 15, 1962; pp. 1915–1920.

*Primary Examiner*—Benjamin Utech
*Assistant Examiner*—Duy Vu Deo
*Attorney, Agent, or Firm*—Sheridan Ross P.C.

[57] ABSTRACT

The present invention is directed to a method for forming dielectric thin films having substantially reduced electrical losses at microwave and millimeter wave frequencies relative to conventional dielectric thin films. The reduction in losses is realized by dramatically increasing the grain sizes of the dielectric films, thereby minimizing intergranular scattering of the microwave signal due to grain boundaries and point defects. The increase in grain size is realized by heating the film to a temperature at which the grains experience regrowth. The grain size of the films can be further increased by first depositing the films with an excess of one of the compoents, such that a highly mobile grain boundary phase is formed.

19 Claims, 18 Drawing Sheets

TUNEABLE DIELECTRIC FILMS HAVING LOW ELECTRICAL LOSSES

FIELD OF THE INVENTION

The present invention relates generally to tunable dielectric materials and specifically to tunable thin film dielectric materials.

BACKGROUND OF THE INVENTION

Tunable dielectric materials have a broad variety of electrical applications, such as in tunable phase shifters, bandpass and band reject filters and Q resonators. Tunable dielectric materials have a dielectric constant that is a function of the electric field applied to the material. By selectively biasing the material and then passing an electromagnetic signal through the material, a characteristic such as the signal's frequency and/or phase can be selectively controlled. Such devices are disclosed in U.S. Pat. Nos. 5,472,935 and 5,589,845, both of which are incorporated herein by reference in their entireties.

Dielectric materials can be formed as thin film and bulk dielectric materials, which have significantly differing electrical properties, even though they can have similar chemical compositions. The differing electrical properties result from substantial differences in the microstructures of the materials. The "microstructure" of a material refers to a combination of the material's grain size, grain shape, and internal stress.

The microstructure of a dielectric material is intrinsic to the technique used to fabricate the material. Thin film dielectric materials are typically formed on a substrate by creation processes, such as RF magnetron DC sputtering, sol-gel, liquid phase epitaxy, electron beam evaporation, thermal evaporation, laser ablation, metal-organic chemical vapor deposition, and chemical vapor deposition. In contrast, bulk dielectric materials are typically monolithic materials (i.e., free standing materials not formed on a substrate) by different creation processes, such as hot pressing, isostatic pressing, jiggering, extrusion, slip casting, band casting, calendaring, injection molding, Czochralski growth, vernevil growth, flame fusion and hydrothermal growth techniques. As a result of the differing deposition processes, thin films typically have orders of magnitude lesser thicknesses than bulk dielectric materials. Although thin film deposition processes can fabricate films up to 10 microns thick, typical film thicknesses range from about 0.05 to 3.0 microns.

Of the two distinct types of dielectric material, thin film material is preferred in constructing electrically tunable devices. Compared to bulk dielectric materials, thin film dielectric materials allow for relatively large electric fields using relatively low bias voltages.

In designing an acceptable electrically tunable thin film device, it is important to provide a high degree of tunability and a minimum of signal loss. Thus, the insertion loss for the device should be maintained as low as possible.

SUMMARY OF THE INVENTION

It is an objective of the present invention to provide an electronically tunable device having a relatively high degree of tunability and a high quality factor. Related objectives are to provide a thin film dielectric material for such a device having a relatively low degree of signal scattering and therefore a relatively low insertion loss.

These and other objectives are realized by the process of the present invention. The process includes the steps of:

(i) selecting a polycrystalline thin film dielectric material to provide a desired degree of tunability of an electromagnetic signal passing therethrough;

(ii) forming a layer of the highly textured or epitaxial, polycrystalline thin film of dielectric material on a crystalline, electrically insulating substrate;

(iii) heating the layer to a temperature sufficient to cause regrowth of the crystals in the layer to form an annealed layer of the thin film dielectric material having a final mean grain size that is more than the initial mean grain size.

To further increase the final mean grain size, the process can include the steps of selecting a superstoichiometric ratio for a component of the selected thin film dielectric material to provide a superstoichiometric composition and substituting the superstoichiometric composition for the stoichiometric thin film dielectric composition in steps (ii) and (iii) above. In the heating step, the temperature is just below the eutectic temperature to provide enhanced grain regrowth. "Eutectic temperature" is the temperature at which the liquid eutectic phase is in thermodynamic equilibrium with the stoichiometric and superstoichiometric phases (wherein the melting temperatures of both phases are higher than the eutectic temperature); "eutectic composition" is the composition of an alloy or solution of two or more substances at which the material is fully melted at the eutectic temperature, "melting temperature" is the temperature at which the solid form of a single-phase component is fully melted, and "stoichiometric ratio" is the ratio of two or more selected substances that are required to form a crystalline, single-phase material. By way of example, the stoichiometric ratio for titanium to strontium in the compound, $SrTiO_3$, is one. A superstoichiometric composition in this compound has a titanium-to-strontium ratio of more than one.

While not wishing to be bound by any theory, it is believed that the increase in mean grain size in the heating step results from the relatively high degree of mobility of the atoms in the grain boundaries that is induced by the relatively high annealing temperatures. As will be appreciated, the temperature at which a liquid phase eutectic is formed is substantially lower than the melting point for the stoichiometric compound. The formation of the liquid phase eutectic at relatively low temperatures permits relatively high mass transport rates to be realized at significantly lower temperatures than would be possible for a stoichiometric composition. The increased grain size provides reduced scattering of the electromagnetic signal due to a concomitant lower concentration of grain boundaries in the thin film dielectric material.

The thin film dielectric material and crystalline substrate are selected such that the lattice mismatch between the material and substrate is sufficient to produce epitaxial growth of the dielectric material on the substrate. Epitaxially grown thin film dielectric materials have a lower population of crystalline defects. Preferably, the lattice mismatch between the dielectric material and substrate is no more than about 5.5% and more preferably is no more than about 2%. Preferred thin film dielectric materials are polycrystalline materials including barium strontium titanate ($Ba_xSr_{1-x}Ca_zTiO_3$) (where $x+y+z=1.0$), potassium tantalate ($KTaO_3$), potassium niobate ($KNbO_3$), lead zirconium titanate ($Pb_xZr_{1-x}TiO_3$) (where x ranges from about 0 to about 1), and mixtures and composites thereof. Preferred substrate materials include lanthanum aluminate ($LaAlO_3$), magnesium oxide (MgO), neodynium gallate ($NdGaO_3$), and aluminum oxide ($Al_2O_3$), and composites thereof.

The thin film dielectric material produced by the process typically has a plurality of interconnected grains having a greater concentration of the selected (superstoichiometric) component in the grain boundaries than in the interiors of the grains. The selected component is present in a substantially stoichiometric ratio in the grain interiors and a superstoichiometric ratio at the grain boundaries. This is so because the material will attempt to reach thermodynamic equilibrium by forming an essentially stoichiometric phase and expelling the excess component from the stoichiometric phase in the grains and into the grain boundaries. The phase at the grain boundaries (i.e., the eutectic phase) is more chemically reactive and mobile than the stoichiometric phase in the grains. Thus, a highly mobile phase with a composition similar to that of the eutectic composition will form even at temperatures lower than the eutectic temperature.

The mean grain size of the material is relatively large. Preferably, the mean grain size is at least about 80% of the thickness of the thin film dielectric material. More preferably, the mean grain size is at least about 3,000 angstroms and most preferably ranges from about 5,000 to about 20,000 angstroms.

Because the thin film dielectric material can have a relatively low population of crystalline defects and a relatively large mean grain size, the material has highly desirable electrical properties for incorporation in electrically tunable devices. The defect concentration in the material typically is no more than about 100 ppm. The electrical resistivity of the material at room temperature preferably is more than about $1 \times 10^9$ ohm/cm, and the dielectric constant is at least about 2,000 and more preferably ranges from about 2,500 to about 6,000. The heating step can increase the dielectric constant by about 40% or more. The dielectric loss of the material is typically no more than about tan $\delta$=0.02. These properties are surprising and unexpected in view of the properties obtained in conventionally deposited thin film dielectric materials.

DETAILED DESCRIPTION

The present invention provides a process for forming thin film dielectric materials having superior electrical properties for use in tunable thin film dielectric devices through the formation of relatively large crystals in the material. Preferred thin film dielectric materials for the process include strontium titanate, barium strontium titanate, barium titanate, barium calcium strontium titanate, lead zirconium titanate, potassium tantalate, and potassium niobate, and mixtures and composites thereof. The most preferred thin film dielectric material has the chemical formula, $(Ba_xSr_yCa_z)TiO_3$, where x+y+z is 1.0.

The process substantially increases the tunability and loss ratio, especially at microwave and millimeter wave frequencies, compared to conventionally prepared thin film dielectric materials. While not wishing to be bound by any theory, it is believed that the decreased electrical losses are realized by the formation of relatively large grain sizes in the material, thereby substantially minimizing intragranular scattering of the signal due to contact of the signal with a multiplicity of grain boundaries in the material.

The process further reduces electrical losses by promoting orderly crystal growth in the thin film dielectric material. The process forms the thin film dielectric material on a crystalline substrate to induce epitaxial growth in the thin film dielectric material. The more ordered crystal structure has a more uniform distribution of grain boundaries and relatively few defects, thereby reducing intragranular scattering of the signal.

To realize the large grain sizes, the process uses a superstoichiometric ratio of a selected thin film dielectric material component to form a solid solution of two or more different compounds—a substantially stoichiometric phase and a superstoichiometric phase. The stoichiometric component lowers the temperature at which a liquid phase is formed, and thus increases the mobility of the film components. The thin film dielectric material is then annealed at a temperature just below the eutectic temperature. In this manner, the thin film dielectric components become sufficiently mobile so as to induce growth of the individual grains. The selected thin film dielectric material component for producing large grain sizes is preferably titanium for titanates, tantalum for tantalates, and niobium for niobates.

To produce orderly crystal growth, the thin film dielectric material is lattice matched to a substrate so as to induce epitaxial crystal growth of the thin film dielectric material. As will be appreciated, "epitaxial growth" refers to crystal growth in which the crystallographic planes in the thin film dielectric material are aligned relative to the alignment of the crystallographic planes in the substrate. The lattice matching of the thin film dielectric material and substrate is discussed in detail below.

Figure 1:
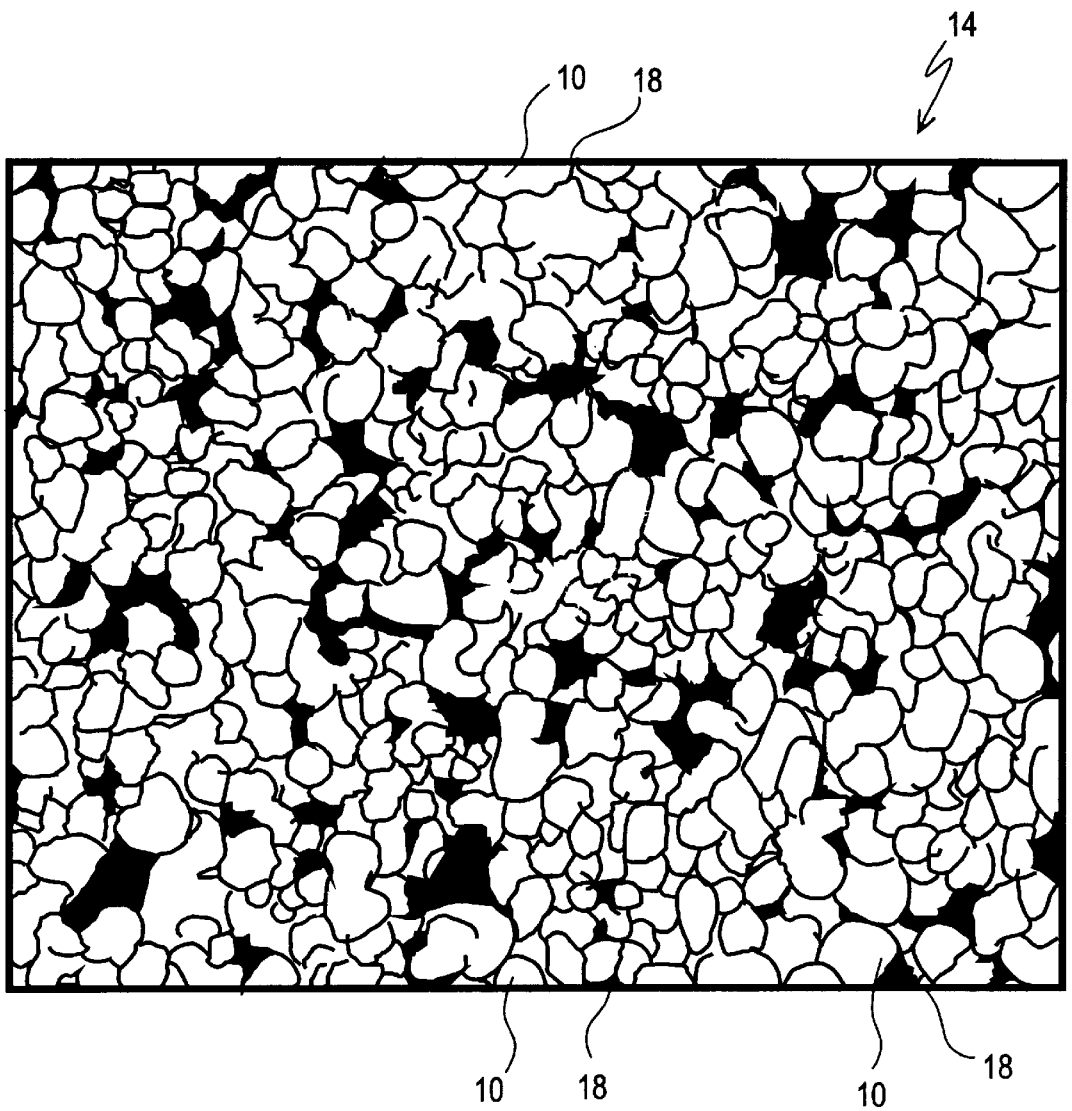
FIG. 1 depicts a thin film dielectric material produced according to the process of the present invention.

FIG. 1 depicts a polycrystalline thin film dielectric material produced by the process of the present invention. The grains or crystals 10 of the thin film dielectric material 14 are separated by a number of grain boundaries 18. Both before and after annealing of the thin film dielectric material, the component that is present in superstoichiometric concentrations has a higher concentration in the grain boundaries 18 than in the interior of the crystals 10. Typically, the concentration of the component at the grain boundaries 18 is at least about 100.5% and more preferably ranges from about 101 to about 103% of the component's concentration in the interior of the crystals 10. Typically, the material in the interior of the crystals 10 has a substantially stoichiometric ratio of the component and the material in the grain boundaries 18 has a superstoichio-metric ratio of the component. This is particularly advantageous in $Ba_xSr_{1-x}TiO_3$ films where it is believed that the titanium-rich $Ba_xSr_{1-x}TiO_3$ phase (e.g., $BaTi_4O_9$) forms at the grain boundaries, which substantially minimizes the overall dielectric loss of the film.

The mean crystal (or grain) size of the thin film dielectric material can be several orders of magnitude larger than that of conventional thin film dielectric materials. Preferably, the mean grain size is at least about 60% of the thickness of the thin film dielectric material and more preferably ranges from about 65 to about 125% and most preferably from about 80 to about 110% of the thickness of the thin film dielectric material. The thickness of the thin film dielectric material preferably is no more than about 20 microns and more preferably ranges from about 0.3 to about 10 microns. Preferably, the mean grain size of the thin film dielectric material is at least about 2,000 angstroms and more preferably ranges from about 3,000 to about 50,000 angstroms and most preferably from about 5,000 to about 20,000 angstroms.

The defect concentration in the material is also significantly less than that in conventionally formed thin film dielectric materials. Typically, the defect concentration is no more than about 100 ppm and more typically ranges from about 10 ppm to about 1,000 ppm and most typically from about 50 ppm to about 400 ppm.

The combination of the relatively large mean grain size and the relatively low population of defects in the thin film dielectric material provides significantly enhanced tunability. To evaluate the quality of tunable dielectric films for electromagnetic tuning applications, a measure known as "K per E" can be employed. "K" is the tunability of the film times the quality factor (Q value), and "E" is the electric field, defined by the DC voltage applied to the two electrodes divided by the distance between electrodes. This parameter permits evaluation of the amount of tuning that can be accomplished with minimal reduction in the Q value of the circuit. The Q value is the ratio of energy transmitted through the device as electromagnetic energy divided by the energy dissipated as heat. Mathematically, these values are given by:

$$K_E = \frac{\Delta \varepsilon_r(v)}{\Delta E} \times \frac{Q_{STO}(v)}{\varepsilon_r(v)}$$

where $\varepsilon_r(v)$ is the voltage dependent dielectric constant of the film, and E=DC voltage/gap-distance.

Preferably, the "K per E" value is at least about 25, more preferably at least about 50, and most preferably at least about 100.

Figure 2:
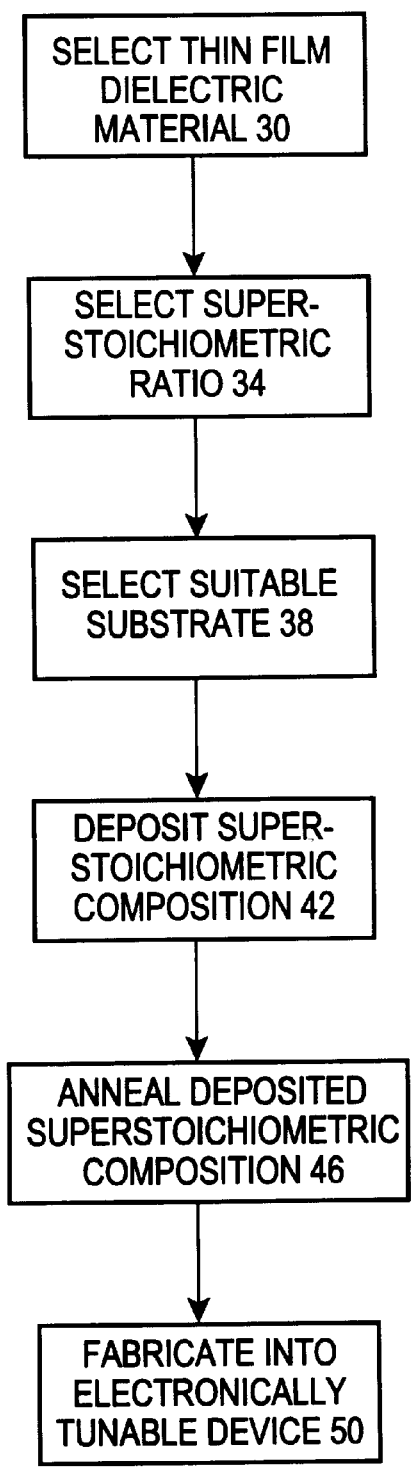
FIG. 2 is a f low schematic of an embodiment of the deposition process of the present invention.

FIG. 2 presents a flow schematic of the process according to the present invention. The steps will be described with reference to titanates. As will be appreciated, the steps, with modifications obvious to one of ordinary skill in the art, can be applied to a number of other thin film dielectric materials, including any of those noted above.

In the first step, a suitable thin film dielectric material is selected 30 that provides adequate tuning at the operating temperature for the device containing the thin film dielectric material. This is determined by, for example, determining the changes in dielectric constants for a number of thin film dielectric materials as a function of applied electric field or temperature. The thin film dielectric material having the greatest variability in the magnitude of the dielectric constant and/or providing a dielectric constant of the desired range of magnitudes is selected. For barium strontium titanate, for example, a desired stoichiometric ratio of barium to strontium (i.e., the value of "x") in the chemical formula, $(Ba_xSr_{1-x})TiO_3$, is selected based on the operating temperature and the desired tuning characteristics of the device. At temperatures less than about 100°K, compositions with x=0 typically provide the best tuning. For ambient temperatures between 230 to 350° K, compositions with $0.2 \leq x \leq 1.0$ typically provide the best tuning.

Figure 3A:
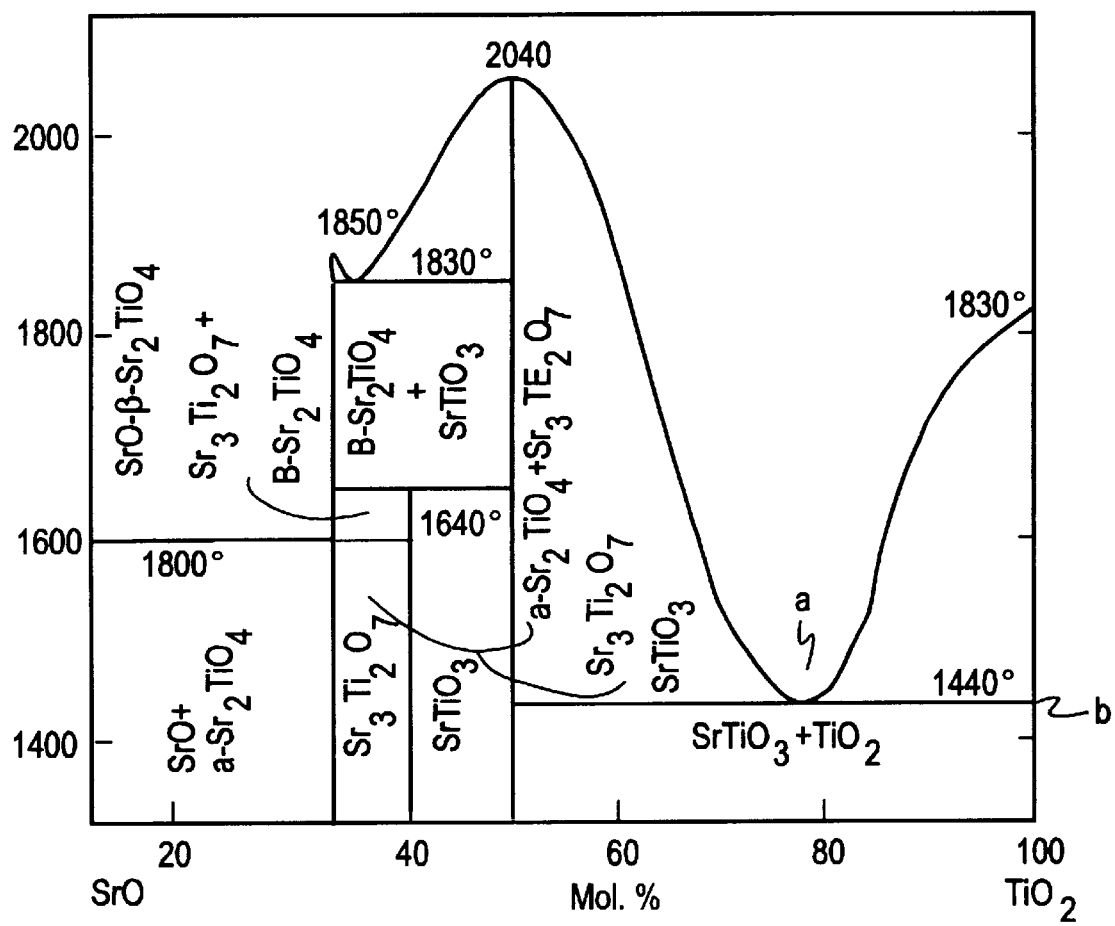
FIGS. 3A and B depict phase diagrams for the $Ba_xSr_{1-x}TiO_3$ system.
Figure 3B:
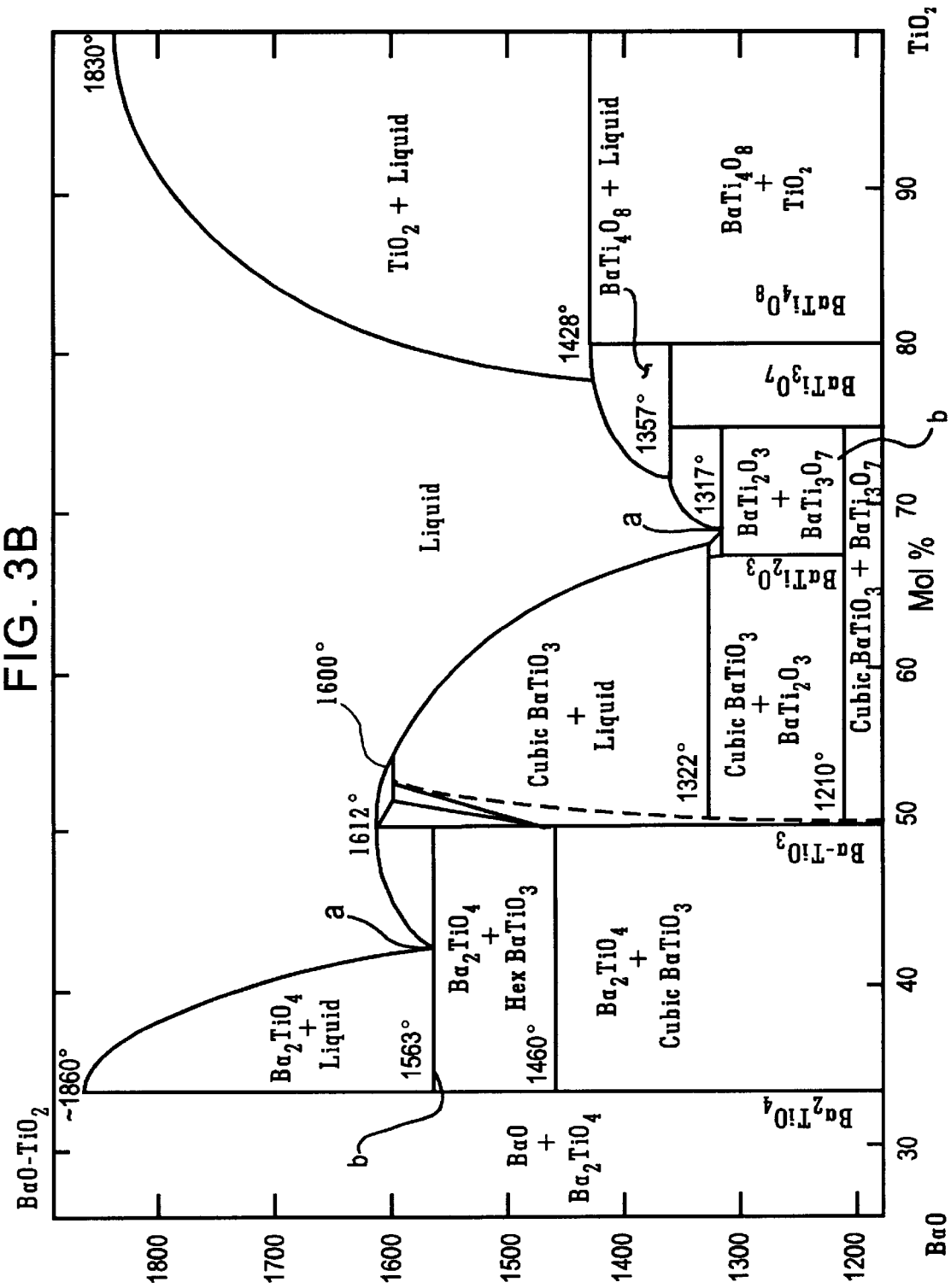

After the desired (stoichiometric) composition of the thin film dielectric material is selected, a superstoichiometric ratio of one of the components of the thin film dielectric material is selected 34 to provide a solid solution of two or more different compounds. In selecting the superstoichiometric ratio, a phase diagram, such as that in FIG. 3, is employed. As will be appreciated, the various eutectic compositions correspond to points "a" and the eutectic temperatures to lines "b". The superstoichiometric composition has a eutectic temperature that is no more than about 80% and most preferably ranges from about 50 to about 79% of the melting temperature of a stoichiometric composition of the dielectric material. Typically, the eutectic temperature is no more than about 1450° C. and most typically ranges from about 1200 to about 1460° C. The superstoichiometric ratio yielding such eutectic temperatures is typically at least about 1.01:1 and most typically ranges from about 1.01:1 to about 1.03:1.

For $Ba_xSr_{1-x}TiO_3$, the superstoichiometric ratio is the molar ratio of titanium for each mole of the selected thin film dielectric material that is to be formed. Thus, the dielectric composition is titanium-rich (i.e., contains a superstoichiometric concentration of titanium relative to the barium and/or strontium concentrations required to yield the desired thin film dielectric material). As noted above, titanium-rich compositions form liquid phases at lower temperatures than do stoichiometric compositions.

After the desired superstoichiometric ratio is selected 34, a suitable substrate is selected 38 to cause epitaxial growth in the deposited thin film dielectric material. There are several desirable criteria for the substrate. First, at the deposition and annealing temperatures, the substrate should be chemically inert to the thin film dielectric material to inhibit interdiffusion between the thin film dielectric material and the substrate. Second, the thermal expansion coefficients of the substrate arid thin film dielectric material must be sufficiently close so as to prevent thermally induced cracking of the thin film dielectric material. Preferably, the thermal coefficient of expansion of the substrate is within about 50% of the thermal coefficient of expansion of the thin film dielectric material. Third, the lattice constants of the substrate and thin film dielectric material should be sufficiently well matched so as to induce highly oriented crystallographic growth of the thin film dielectric material. Preferably, the lattice mismatch between the thin film dielectric material and the substrate is no more than about 8%, and more preferably ranges from about 0.2 to about 8% and most preferably ranges from about 1 to about 8%. Fourth, the electrical impedance of the substrate must be more than the electrical impedance of the thin film dielectric material to insure that the signal will propagate primarily through the thin film dielectric material (and therefore be selectively tuned by varying the dielectric constant of the thin film dielectric material). The dielectric substrate preferably has a dielectric constant that is no more than about 1.5% of the dielectric constant of the thin film dielectric constant. Preferred electrically insulating crystalline substrates for the thin film dielectric materials noted above include lanthanum aluminate, magnesium oxide, neodynium gallate, and aluminum oxide (provided the aluminum oxide has a chemically inert buffer layer such as cesium oxide) and mixtures and composites thereof.

Next, the superstoichiometric composition is deposited 42 on the substrate. The composition is preferably deposited by in-situ techniques (i.e., techniques in which the composition is deposited at elevated temperatures), such as sputtering, laser deposition, and metal organic chemical vapor deposition, or ex-situ techniques (i.e., techniques in which the composition is deposited at ambient temperatures), such as sol-gel techniques. The composition is more preferably deposited by in-situ techniques at temperatures ranging from about 600 to about 800° C. in an atmosphere containing molecular oxygen partial pressure ranging from about $1 \times 10^{-3}$ to 0.10 Torr, an oxygen precursor, or mixtures thereof. This typically yields a highly oriented (first) median grain size ranging from about 30 to about 150 nanometers and most preferably ranging from about 50 to about 100 nanometers.

The deposited superstoichiometric composition (which includes a stoichiometric phase and a eutectic (superstoichiometric) phase) is next annealed 46 at a temperature just below the eutectic temperature to induce enlargement of the grains to a final median grain size that is greater than the initial median grain size. The annealing temperature is preferably at least about 70% and more preferably ranges from about 75 to about 90% of the eutectic temperature. More specifically, the annealing temperature preferably is at least about 1000° C. and more preferably ranges from about 1,000 to about 1,250° C.

The composition and pressure of the annealing atmosphere for the annealing step can have a significant impact upon crystal growth kinetics and upon the electrical properties of the annealed thin film dielectric material.

A flux can be applied to the layer to catalyze crystal regrowth. Preferred fluxes include titanium dioxide ($TiO_2$), tungsten oxide ($WO_3$), tantalum oxide ($Ta_2O_5$), niobium oxide ($Nb_2O_5$), and mixtures thereof.

The duration of the annealing step is also an important factor to crystal regrowth. Preferably, the duration of the annealing step ranges from about 0.25 to about 24 hrs., more preferably from about 1 to about 8 hrs., and most preferably from about 1 to about 7 hrs.

Figure 4:
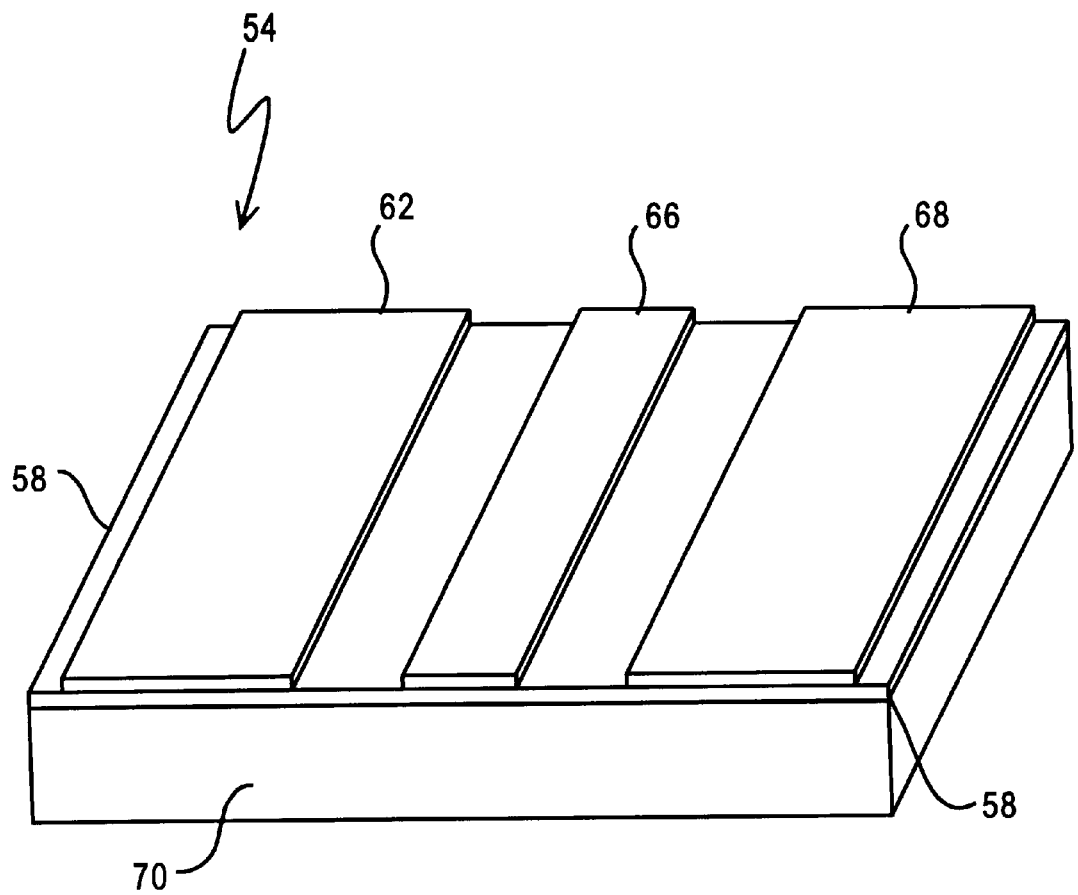
FIG. 4 depicts an electrically tunable device incorporating the thin film dielectric material.

Finally, the substrate and annealed thin film dielectric material are fabricated 50 into an electrically tunable device. FIG. 4 depicts a tunable varactor 54 utilizing a thin film dielectric material 58 deposited according to the present invention. The tunable varactor 54 includes conductors 62, 66, and 68 supported by the substrate 70 with the thin film dielectric material 58 located beneath (and/or between) the conductors 62, 66, and 68 to provide a variable capacitance.

The conductors can be a high temperature superconductor, such as YBCO, or a normal conductor, such as a metal. A variable bias can be applied to the material 14 via the conductors 62, 66, and 68 or electrical leads (not shown) attached to the material 58 to vary the dielectric constant, thereby producing a variable capacitance across the gap between the conductors 62, 66, and 68. An electromagnetic signal is passed between the conductors 62, 66, and 68 and through the dielectric material 58 to provide tuning of the signal. As will be appreciated, the majority of the signal passes through the dielectric material 58 with a lesser portion passing through the substrate 70. Varying the capacitance enables the operating frequency or phase of the signal to be controlled selectively, thereby enabling the circuit to be electronically controlled from remote locations. Lowering the loss of the material 58 in turn improves the performance of circuits utilizing such varactors.

EXPERIMENT 1

Figure 5:
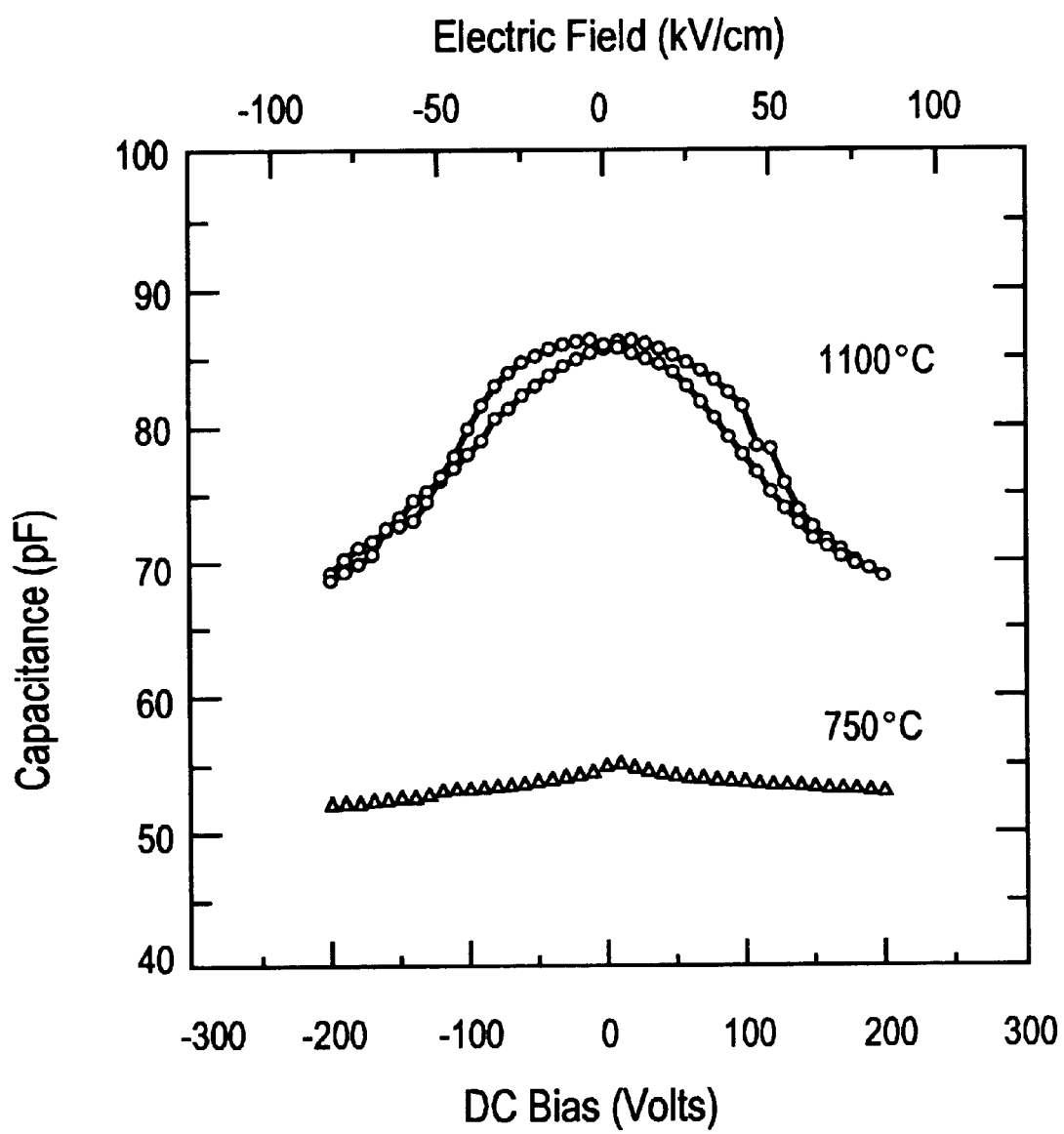
FIG. 5 is a plot of capacitance versus the bias applied to a BTO film.
Figure 6:
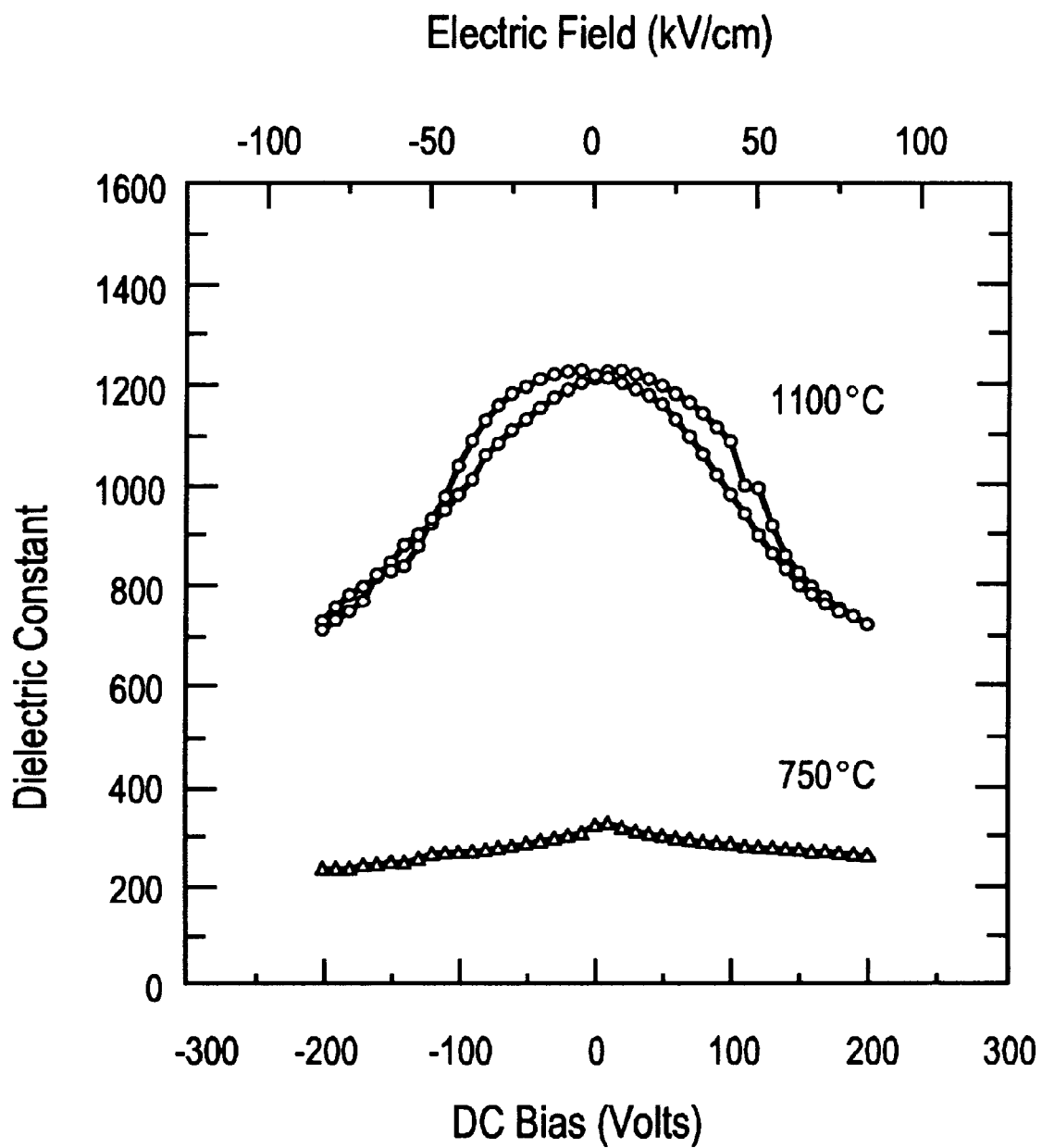
FIG. 6 is a plot of electric field and dc bias versus dielectric constant for the BTO film.

A number of thin film dielectric devices were fabricated to demonstrate the advantages of the present invention over thin film dielectric devices fabricated by other techniques. First, barium titanates were deposited and post-annealed at 750 and 1100° C. The barium titanate films were initially deposited using sol-gel techniques. FIGS. 5 and 6 illustrate the dramatically higher tuning for the film post-annealed at 1100° C. relative to the film post-annealed at 750° C.

Figure 7:
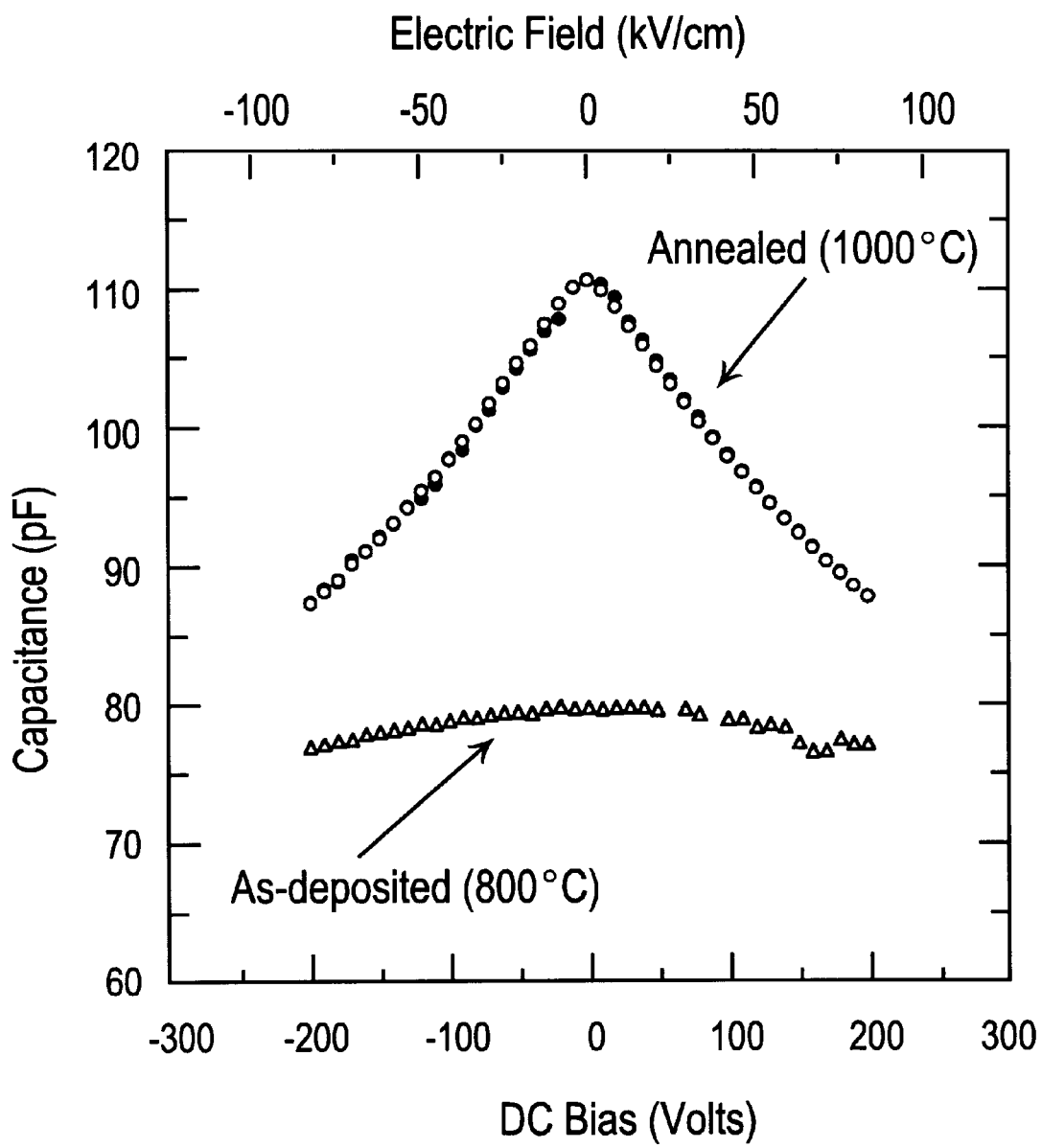
FIG. 7 is a plot of electric field and dc bias versus capacitance for an STO film.
Figure 8:
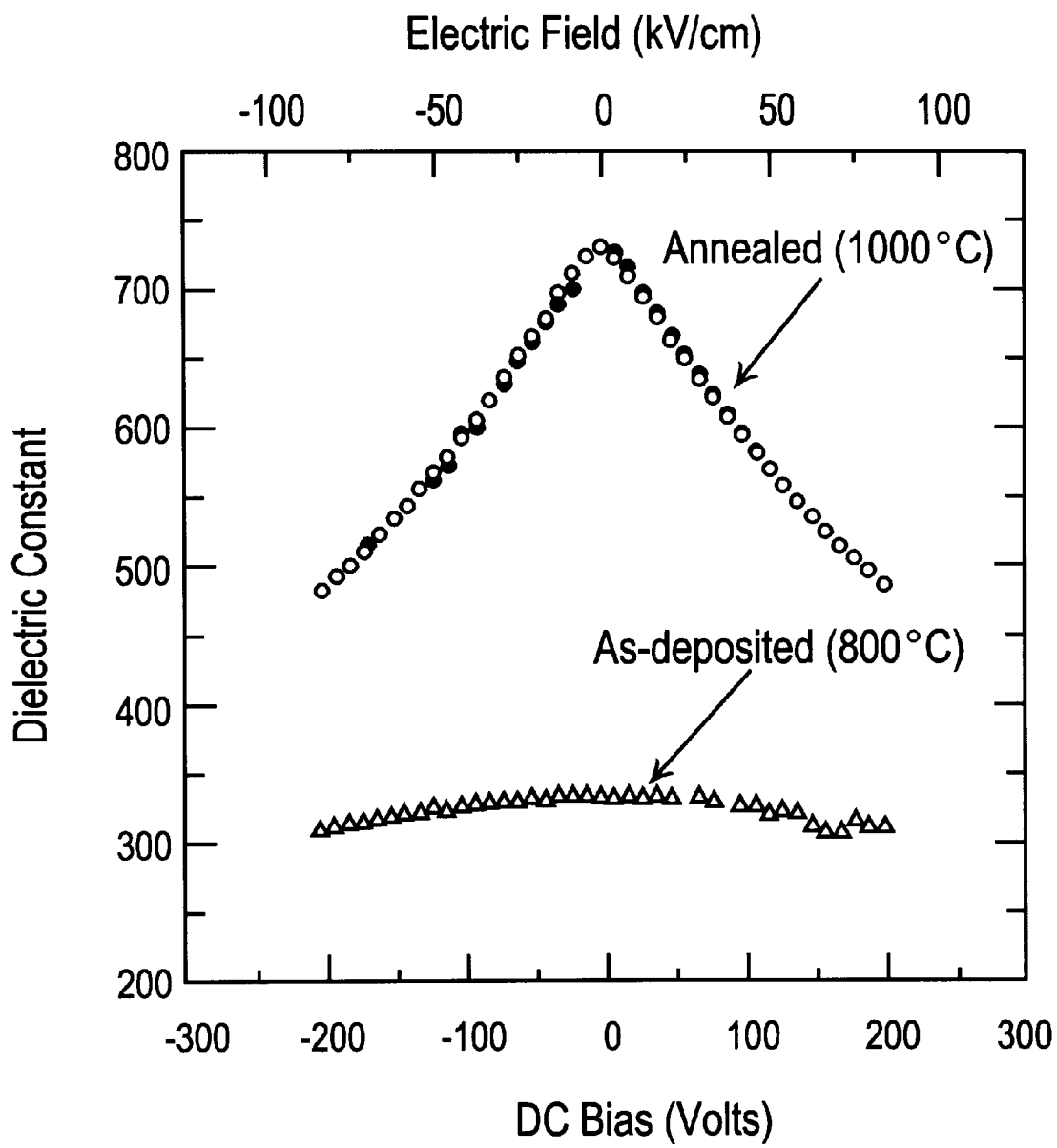
FIG. 8 is a plot of electric field and dc bias versus dielectric constant for the STO film.

Strontium titanate thin film devices were fabricated and post-annealed. The strontium titanate films were formed by sputter-deposition techniques at a temperature of 800° C. The strontium titanate film was then post-annealed at a temperature of 1000° C. for 5 hours. FIGS. 7 and 8 demonstrate the dramatically higher tuning for the post-annealed film relative to the as-deposited film.

EXPERIMENT 2

Figure 9:
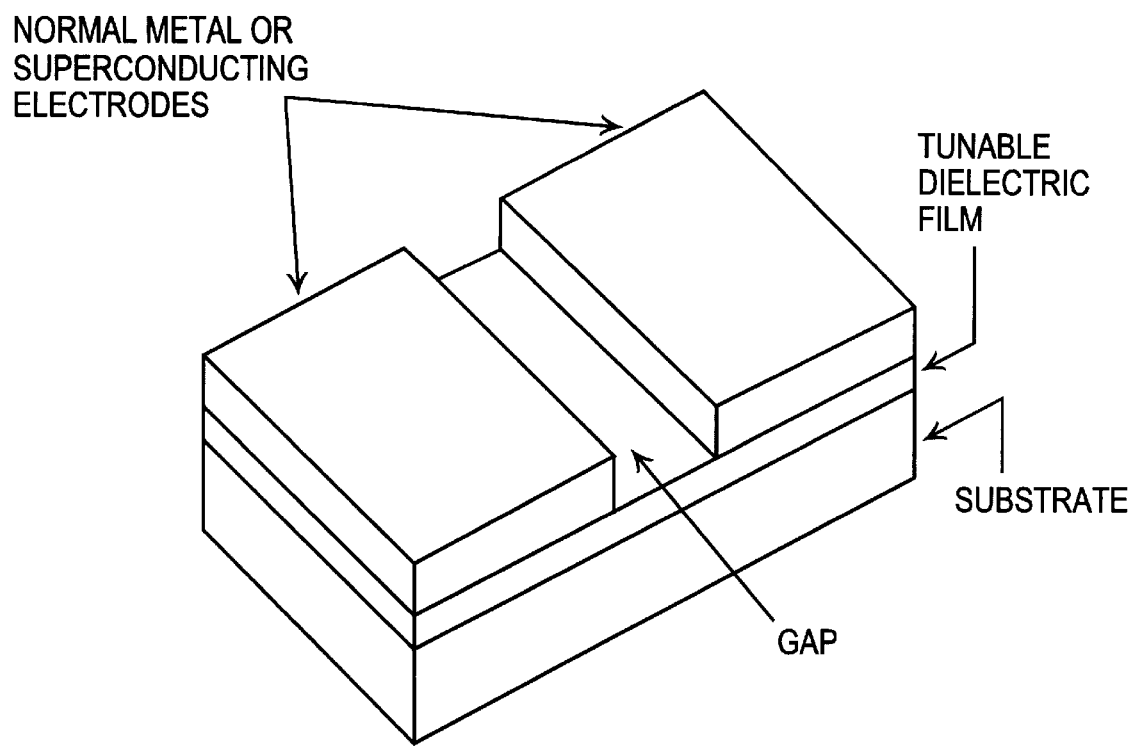
FIG. 9 depicts a tunable dielectric varactor used in Experiment 2.

Further experiments were performed utilizing a tunable dielectric varactor having the configuration depicted in FIG. 9. The tunable dielectric varactor includes a ferroelectric or paraelectric film, such as $(Ba_xSr_{1-x})TiO_3$, deposited on electrically insulating substrates such as lanthanum aluminate or neodynium gallate. For the data shown in FIGS. 10–17, the thickness of the tunable dielectric film was normally 0.3 microns. The unannealed films were deposited at a substrate temperature of 750° C. using pulse laser deposition, and the annealed films were subsequently annealed at 1180° C. for 7 hours prior to depositing electrodes, and the gap between electrodes ranged from 11 to 16 microns. Measurements of the varactor properties were taken at 1 to 2 GHz by bonding the varactors into a 2-port resonance circuit and measuring the shift in resonant frequency in Q values as a function of DC electric field.

Figure 10:
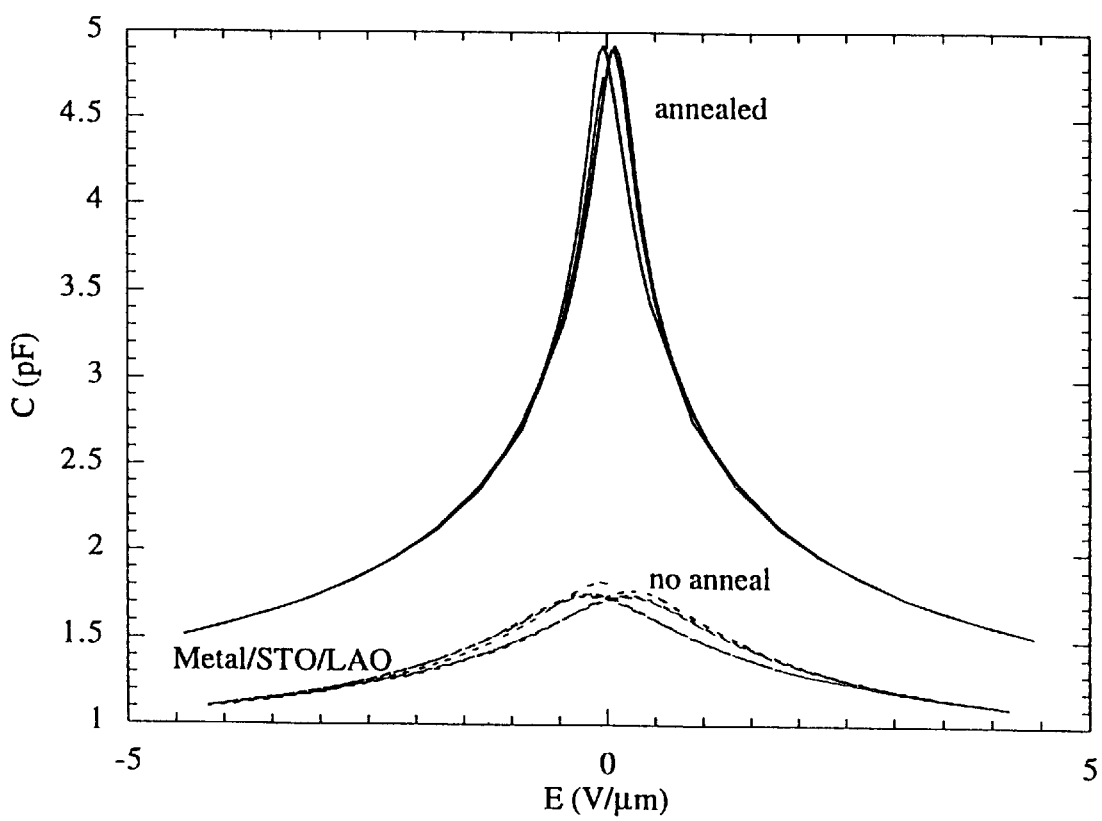
FIG. 10 is a plot of capacitance versus electric field for a tunable dielectric varactor using gold electrodes.

FIG. 10 shows a capacitance for various electric fields for an STO varactor with normal metal electrodes. Note the higher capacitance value for the annealed varactor demonstrates that the annealed varactor showed much higher dielectric constant values in tuning than the unannealed varactor. The annealing substantially reduced the hysteresis in the varactor after repeating cycling of the DC voltages in the varactor. After repeated cycling of the DC voltages, the capacitance values for a given DC electric field were substantially unchanged.

Figure 11:
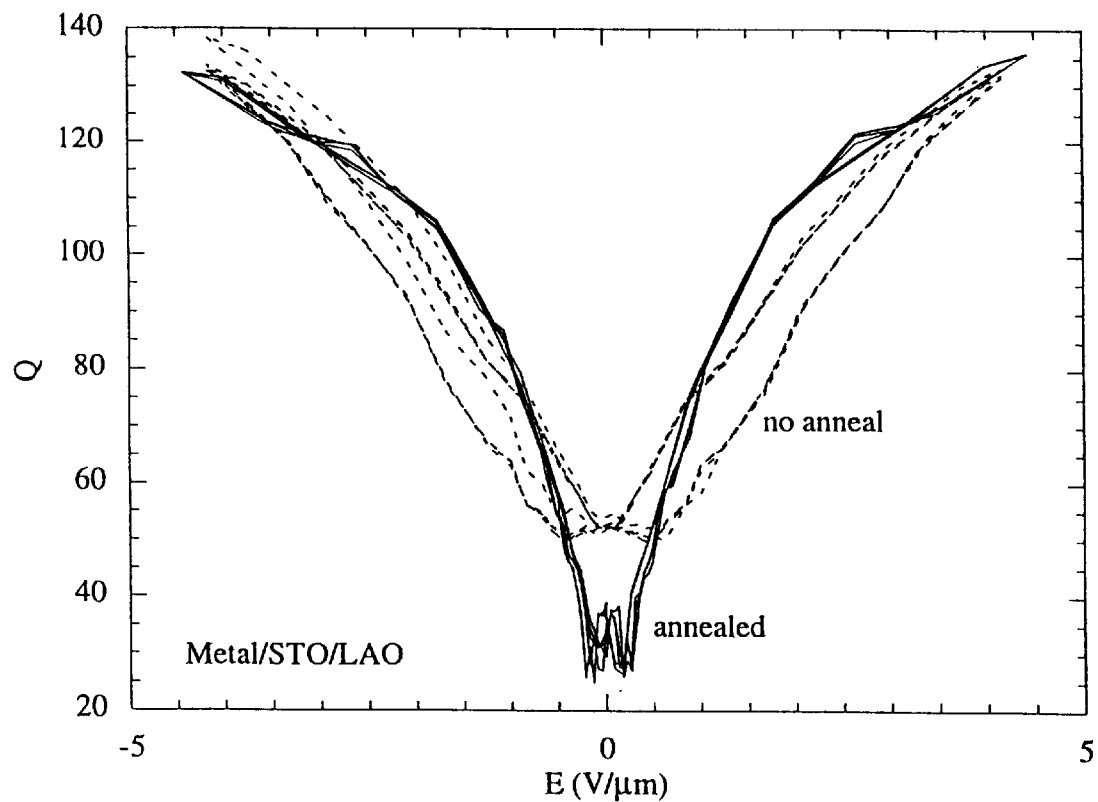
FIG. 11 is a plot of quality factor versus electric field for the tunable dielectric varactor of FIG. 10.

FIG. 11 depicts the Q values for various electric fields for the same varactor. At low electric fields, the Q values of the annealed varactors were lower than those of the unannealed varactors. Thus, the annealed varactors dissipated more of the RF energy as heat compared to the unannealed varactors.

Figure 12:
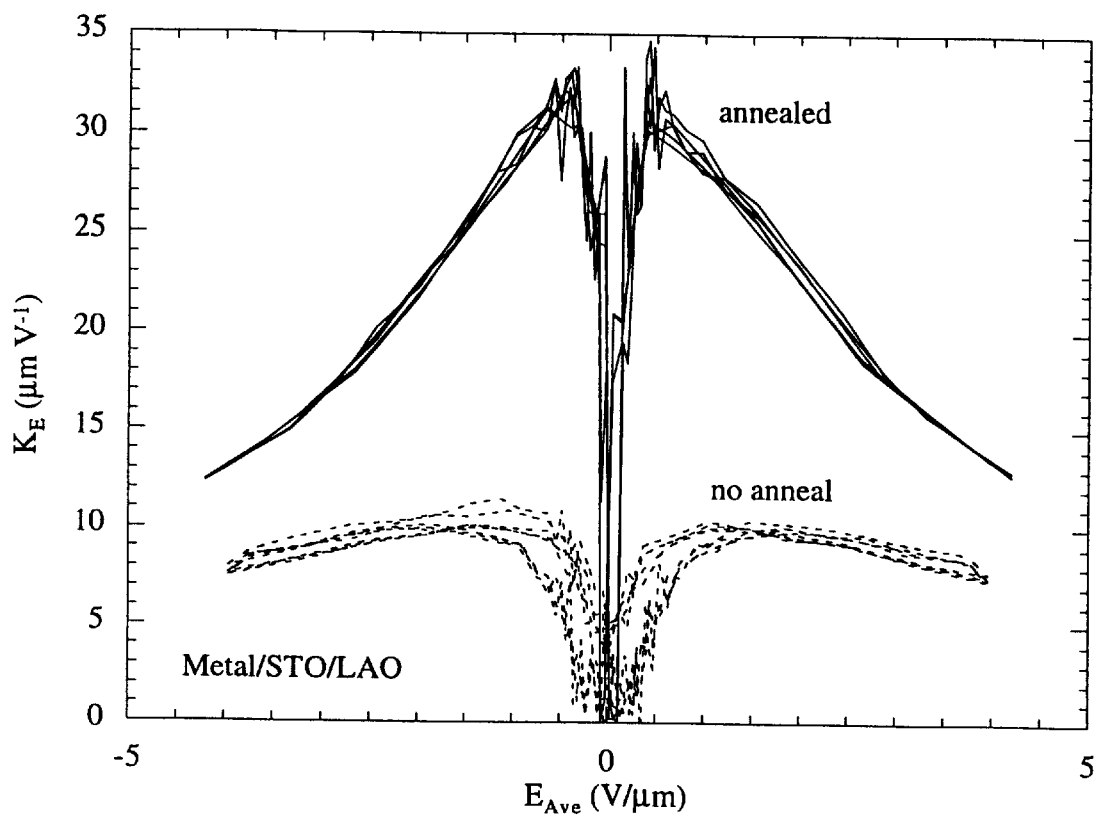
FIG. 12 is a plot of $K_E$ versus average electric field for the tunable dielectric varactor of FIG. 10.

FIG. 12 depicts $K_E$ versus electric field. "$K_E$" refers to the "K per E" variable noted above. The annealed films are far superior to the unannealed film when measured using this variable. Thus, microwave circuits using these varactors can be tuned significantly with only a moderate loss introduced by the varactor.

Figure 13:
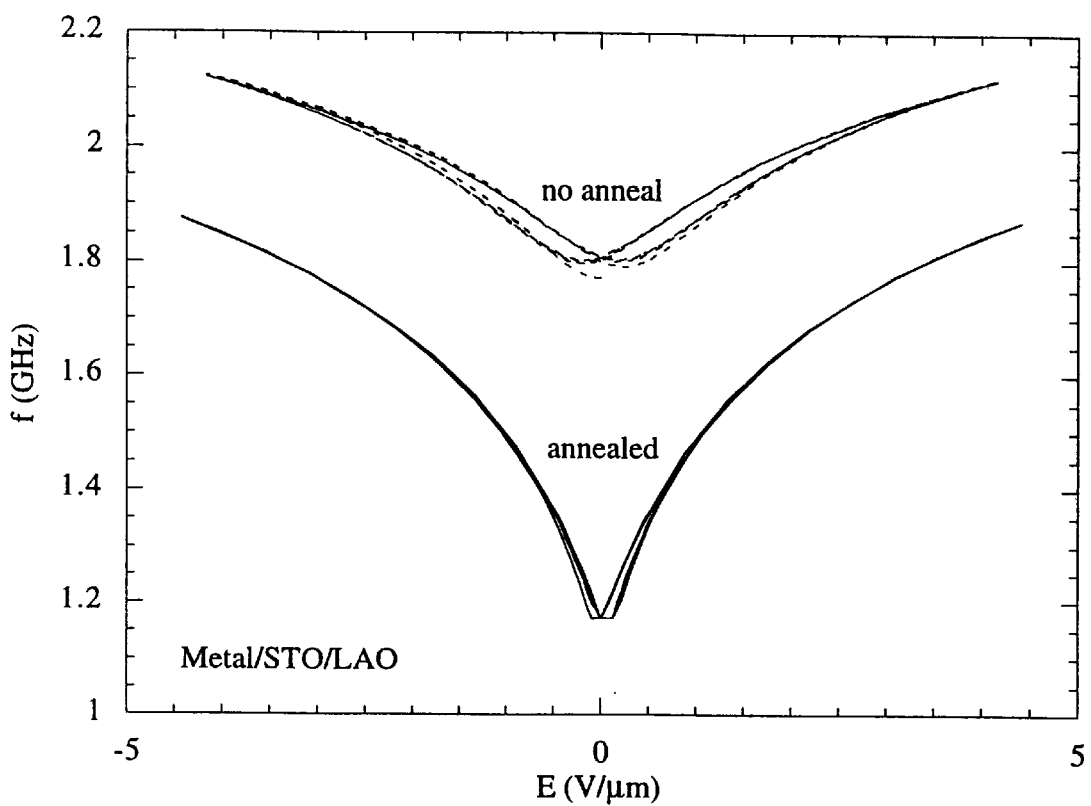
FIG. 13 is a plot of the frequency of the RF signal versus electric field strength for the tunable dielectric varactor of FIG. 10.
Figure 14:
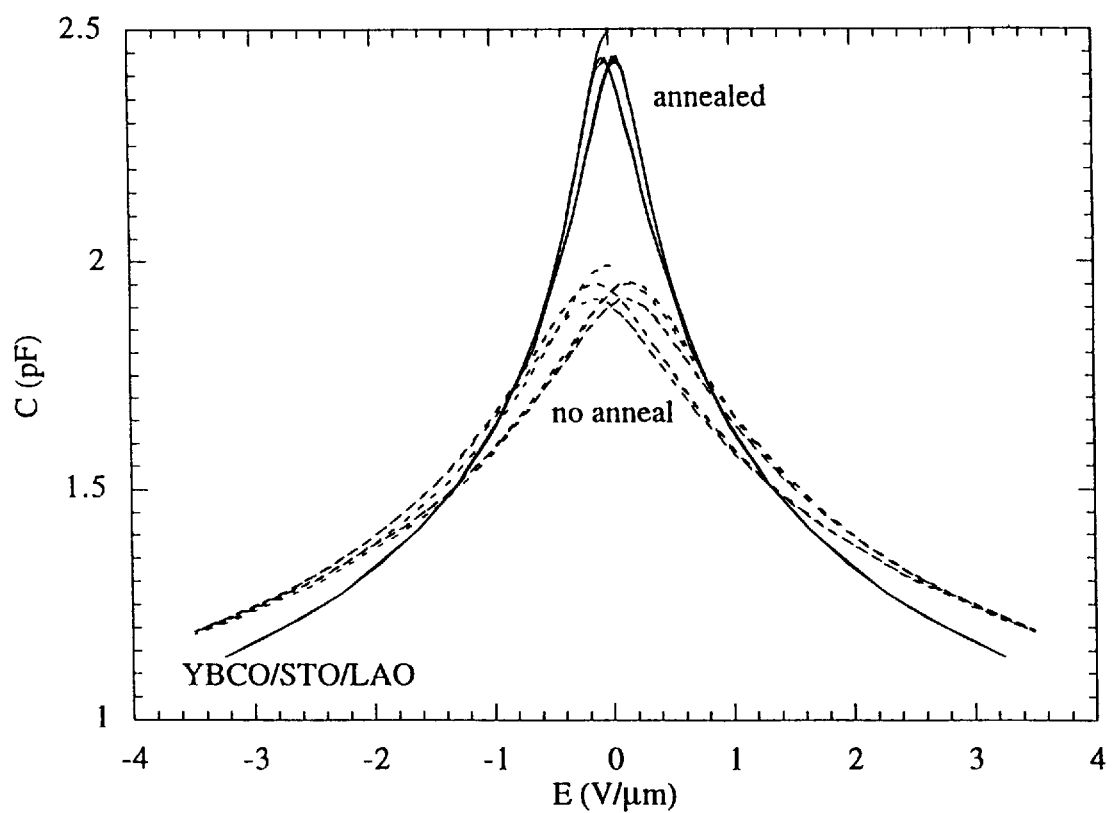
FIG. 14 is a plot of capacitance versus electric field strength for the tunable dielectric varactor of FIG. 9 utilizing superconducting electrodes.
Figure 15:
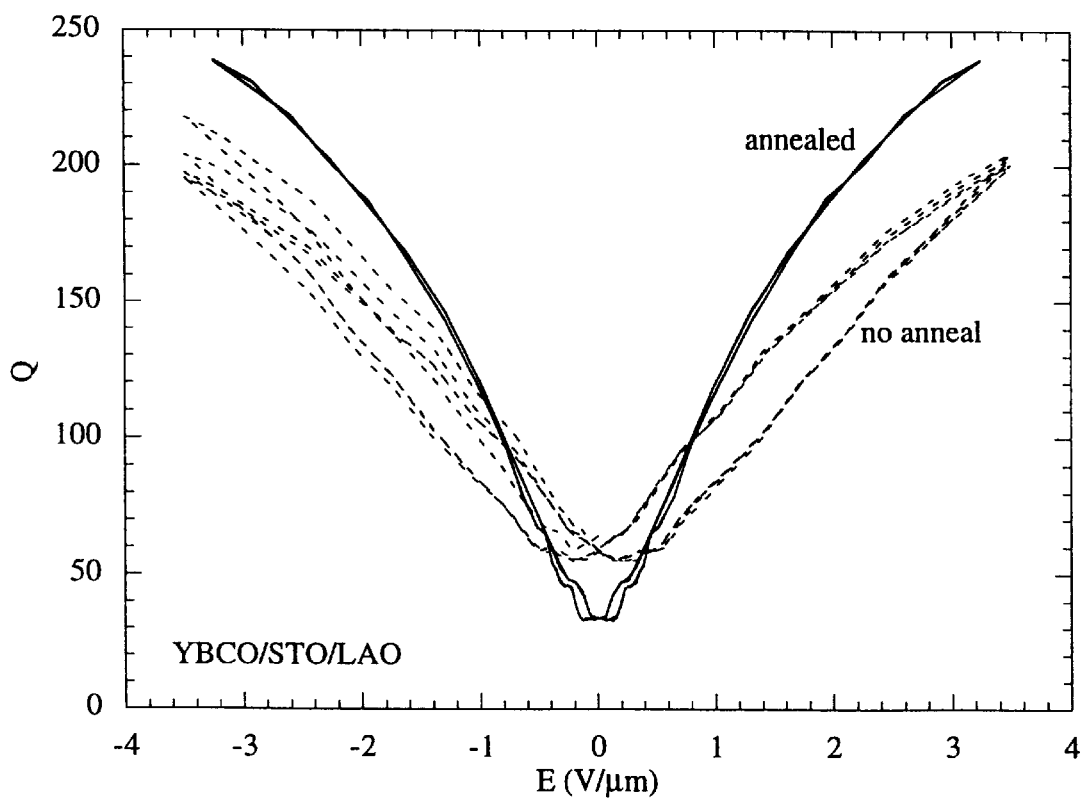
FIG. 15 is a plot of quality factor versus electric field strength for the tunable dielectric varactor of FIG. 14.
Figure 16:
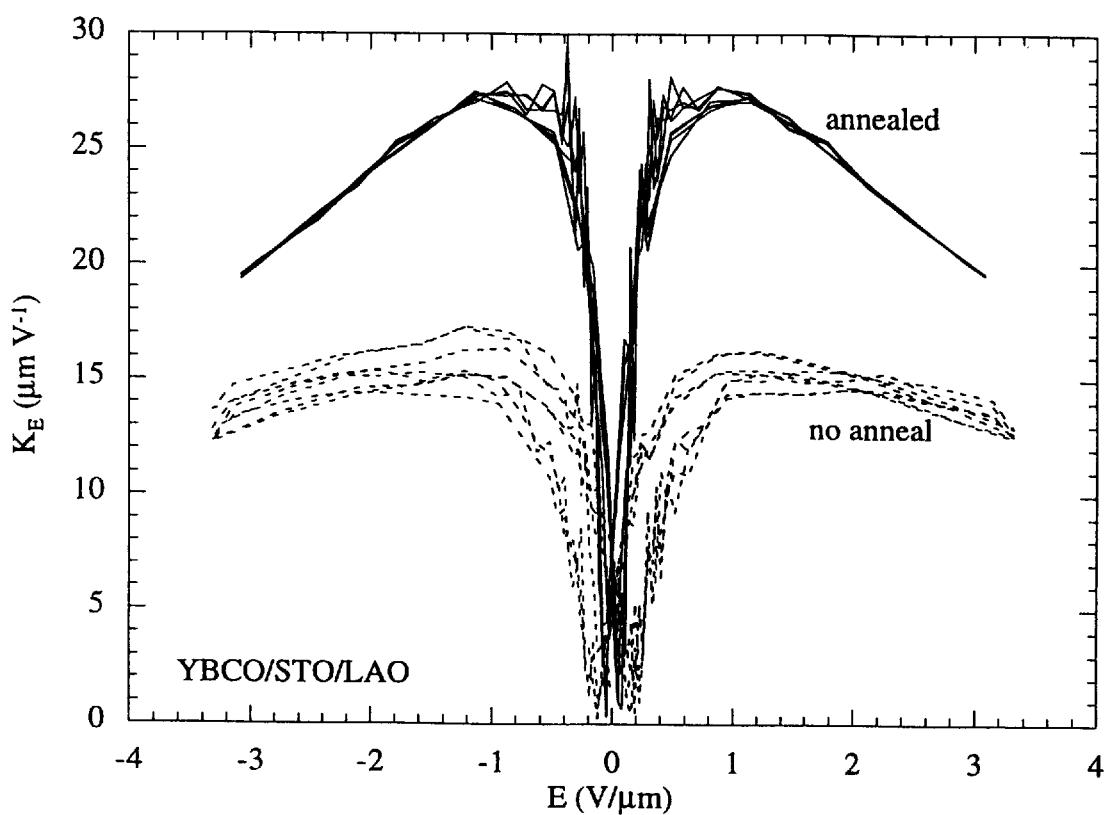
FIG. 16 is a plot of $K_E$ versus electric field strength for the tunable dielectric varactor of FIG. 14.
Figure 17:
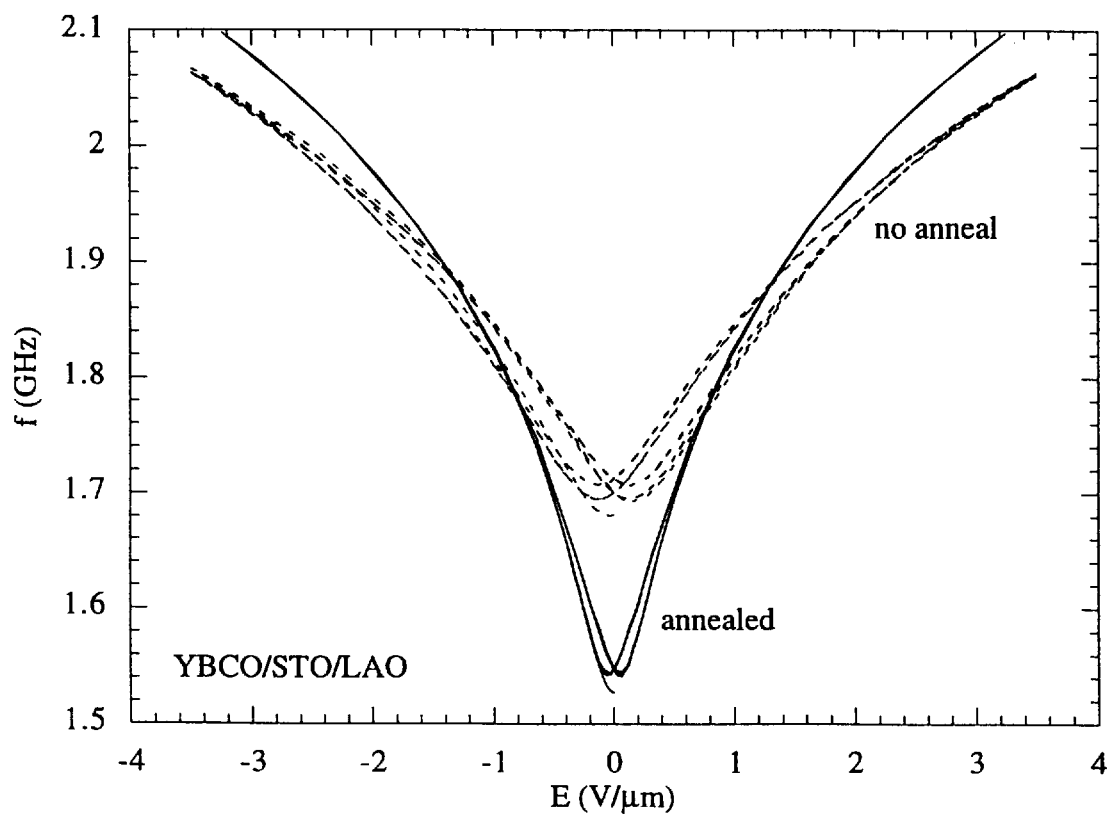
FIG. 17 is a plot of the frequency of the RF signal versus electric field strength for the tunable dielectric varactor of FIG. 14.

FIG. 13 depicts the shift in resonant frequency as a function of DC electric field for a 2-port microstrip resonant frequency, with tunable dielectric varactors bonded into the circuit at positions where the RF voltage is close to a maximum.

FIGS. 14–17 are identical to FIGS. 10–13, except that the electrodes are comprised of a high temperature superconducting material ($YBa_2Cu_3O_{7-x}$) rather than Au.

The results in FIGS. 10–17 are presented below in Table 1:

heating the layer to a temperature below the eutectic temperature to form an annealed layer of the thin film dielectric material having a final mean grain size, wherein the final mean grain size is more than the initial mean grain size and wherein the temperature is at least about 70% of the eutectic temperature.

2. The method of claim 1, wherein the substrate is selected from the group consisting of lanthanum aluminate, magnesium oxide, neodynium gallate, and aluminum oxide, and mixtures and composites thereof.

3. The method of claim 1, wherein the eutectic temperature ranges from about 1200 to about 1450° C.

4. The method of claim 1, wherein the dielectric material is selected from the group consisting of strontium titanate, barium strontium titanate, barium titanate, potassium tantalate, potassium niobate, lead zirconium titanate, and mixtures thereof.

5. The method of claim 1, wherein in the dielectric material the molar ratio of Ti on the other hand to Ba and Sr on the other ranges from about 1.01 to about 1.10.

6. The method of claim 1, wherein in the forming step the deposition method for forming the layer of dielectric material is one of sputtering, laser ablation, sol-gel, metal-organic chemical vapor deposition, chemical vapor deposition, liquid phase epitaxy, electron beam evaporation, and thermal evaporation.

7. The method of claim 1, wherein the resistivity of the annealed layer of thin film dielectric material is at least about $1 \times 10^9$ ohm-cm.

| Sample | Dielectric constant at E = 0 | Dielectric constant at maximum E(E = 3–5 V/μm) | Q at E-0 | Q at maximum E(E = 3–5 V/μm) | Maximum $K_8$ (μm/V) |
|---|---|---|---|---|---|
| 3000 Å $SrTiO_3$ film on $LaAlO_3$, no post-anneal, gold electrodes | 1383 | 890 | 50 | 138 | 11 (at 1 V/μm) |
| 3000 Å $SrTiO_3$ film on $LaAlO_3$ substrate, post-annealed at 1180° C. for 7 hours, gold electrodes | 4465 | 1366 | 30 | 133 | 33 (at 0.6 V/μm) |
| 3000 Å $SrTiO_3$ film on $LaAlO_3$ substrate, no post-anneal, YBCO electrodes | 1990 | 1225 | 40 | 220 | 17 (at 0.6 V/μm) |
| 3000 Å $SrTiO_3$ film on $LaAlO_3$ substrate, post annealed at 1180° C. for 7 hours, YBCO electrodes | 2855 | 1040 | 30 | 245 | 27 (at 0.6 V/μm) |

While various embodiments of the present invention have been described in detail, it is apparent that modifications and adaptations of those embodiments will occur to those skilled in the art. It is to be expressly understood, however, that such modifications and adaptations are within the scope of the present invention, as set forth in the appended claims.

What is claimed is:

1. A method for forming a thin film dielectric material, comprising:

selecting a superstoichiometric ratio between two or more components of a selected thin film dielectric material to provide a superstoichiometric composition;

forming the two or more components in the superstoichiometric ratio into the superstoichiometric composition;

applying the superstoichiometric composition to a crystalline substrate to form a layer of the superstoichiometric composition having an initial mean grain size, wherein a lattice mismatch between the crystalline substrate and the layer of the superstoichiometric composition is sufficient to cause epitaxial growth of the superstoichiometric composition on the crystalline substrate; and 8. The method of claim 1, wherein the dielectric constant of the annealed layer of thin film dielectric material is at least about 2,000.

9. The method of claim 1, wherein the dielectric loss of the annealed layer of thin film dielectric material is no more than about tan δ=0.02.

10. The method of claim 1, wherein the annealed layer has a thickness and the final mean grain size is at least about 60% of the thickness.

11. The method of claim 1, wherein the lattice mismatch is no more than about 8%.

12. The method of claim 1, wherein the thin film dielectric material is $(Ba_xSr_{1-x})_yTiO_3$, where $0 \leq x \leq 1$ and y<1 such that the ratio between titanium on the one hand and strontium and barium on the other is more than one.

13. The method of claim 1, wherein the dielectric constant of the crystalline substrate is no more than about 1.5% of the dielectric constant of the thin film dielectric material.

14. The method of claim 1, wherein the thin film dielectric material has the chemical formula, $(Ba_xSr_{1-x})_yTiO_3$, where x ranges from about 0 to about 1 and y is less than 1 and comprises a plurality of interconnected grains, the grains being separated by grain boundaries, wherein Ti has an initial concentration at the grain boundaries and a final concentration at the interiors of the grains and the first concentration is more than the second concentration.

15. The method of claim 1, wherein the thin film dielectric material includes a plurality of interconnected grains separated by grain boundaries, wherein an initial ratio between two components of the thin film dielectric material at the grain boundaries is superstoichiometric and a final ratio between the two components at the interiors of the grains is substantially stoichiometric.

16. The method of claim 15, wherein the thin film dielectric material has a thickness and the plurality of interconnected grains have a mean grain size and wherein the mean grain size is at least about 60% of the thickness.

17. A method for forming a thin film dielectric material, comprising:

epitaxially growing a thin film dielectric material on a substrate having an initial mean grain size, wherein the thin film dielectric material is a eutectic composition and has a eutectic temperature, and heating the thin film dielectric material to a temperature that is at least about 70% of the eutectic temperature to form an annealed thin film dielectric material having a final mean grain size, wherein the second mean grain size is larger than the first mean grain size.

18. The method of claim 17, wherein a lattice mismatch between the thin film dielectric material and the substrate is no more than about 5.5%.

19. The method of claim 17, wherein the heating step is performed in the presence of a flux selected from the group consisting of titanium dioxide, tungsten oxide, tantalum oxide, niobium oxide, and mixtures thereof and in the presence of molecular oxygen.

* * * * *